United States Patent
Wu et al.

(10) Patent No.: US 7,882,889 B2
(45) Date of Patent: *Feb. 8, 2011

(54) LOOP TYPE HEAT DISSIPATING APPARATUS WITH SPRAYER

(75) Inventors: Shih-Kuo Wu, Hsinchu Hsien (TW); Kuo-Hsiang Chien, Hsinchu Hsien (TW); Jinn-Cherng Yang, Hsinchu Hsien (TW); Chi-Ming Huang, Hsinchu Hsien (TW)

(73) Assignee: Industrial Technology Research Institute, Hsinchu Hsien (TW)

( * ) Notice: Subject to any disclaimer, the term of this patent is extended or adjusted under 35 U.S.C. 154(b) by 720 days.

This patent is subject to a terminal disclaimer.

(21) Appl. No.: 11/594,149

(22) Filed: Nov. 8, 2006

(65) Prior Publication Data

US 2007/0284090 A1 Dec. 13, 2007

(30) Foreign Application Priority Data

Jun. 12, 2006 (TW) .............................. 95120789 A

(51) Int. Cl.
*F28D 15/00* (2006.01)

(52) U.S. Cl. .............................. 165/104.23; 165/104.21; 165/104.26; 165/908; 62/259.2; 361/700

(58) Field of Classification Search ................ 165/80.3, 165/104.21, 104.23, 104.26, 104.33, 908; 62/259.2; 361/700; 310/10, 11
See application file for complete search history.

(56) References Cited

U.S. PATENT DOCUMENTS

| 3,344,853 | A | * | 10/1967 | Singer | ................... | 165/104.23 |
| 3,444,419 | A | * | 5/1969 | Hansen et al. | ......... | 165/104.23 |
| 3,792,293 | A | * | 2/1974 | Marks | ........................ | 310/11 |

(Continued)

FOREIGN PATENT DOCUMENTS

TW 508487 6/1990

(Continued)

OTHER PUBLICATIONS

Amon, Cristina H., MEMS-enabled thermal management of high-heat-flux devices EDIFICE: embedded droplet impingement for integrated cooling of electronics, 2001, Experimental Thermal and Fluid Science, 25, 231-242.*

*Primary Examiner*—Ljiljana (Lil) V Ciric
(74) *Attorney, Agent, or Firm*—Birch, Stewart, Kolasch & Birch, LLP

(57) ABSTRACT

A loop type heat dissipating apparatus with a sprayer for transferring heat between a heat source and a heat sink includes an evaporator, a condenser, and a working fluid. The evaporator contacts the heat source and includes a first chamber, a second chamber, and a sprayer disposed between therebetween. The condenser contacts the heat sink and includes a third chamber communicating with the second chamber and a wick structure disposed on one side of the third chamber. The working fluid fills the loop type heat dissipating apparatus and is turned into microdroplets via a sprayer. The sprayer impinges the microdroplets into the second chamber where the microdroplets are then evaporated by the heat source before proceeding to the third chamber for condensation, liquefaction and adhering to the wick structure. Eventually, the working fluid flows back to the first chamber under a pumping force actuated by the sprayer and completes the cycle.

13 Claims, 5 Drawing Sheets

U.S. PATENT DOCUMENTS

| | | | | |
|---|---|---|---|---|
| 4,523,112 A | * | 6/1985 | Marks | 310/10 |
| 4,572,285 A | * | 2/1986 | Botts et al. | 165/104.23 |
| 6,105,662 A | * | 8/2000 | Suzuki | 165/104.33 |
| 6,427,453 B1 | * | 8/2002 | Holtzapple et al. | 62/92 |
| 6,629,646 B1 | * | 10/2003 | Ivri | 239/4 |
| 6,708,515 B2 | * | 3/2004 | Malone et al. | 62/259.2 |
| 6,888,721 B1 | * | 5/2005 | Moghaddam et al. | 361/700 |
| 7,007,746 B2 | * | 3/2006 | Wu et al. | 165/104.26 |
| 7,108,056 B1 | * | 9/2006 | Moghaddam et al. | 361/700 |
| 7,369,469 B2 | * | 5/2008 | Watanabe et al. | 369/47.5 |
| 2002/0088243 A1 | * | 7/2002 | Holtzapple et al. | 62/268 |
| 2004/0154328 A1 | * | 8/2004 | Holtzapple et al. | 62/268 |
| 2005/0180106 A1 | * | 8/2005 | Ohashi et al. | 361/699 |
| 2006/0283577 A1 | * | 12/2006 | Liu et al. | 165/104.26 |

FOREIGN PATENT DOCUMENTS

| | | |
|---|---|---|
| TW | 502101 | 8/1990 |
| TW | 1225584 | 5/1992 |
| TW | 1241156 | 12/1992 |
| TW | 1251656 | 12/1992 |
| TW | 1236337 | 2/1993 |
| TW | M260724 | 7/1993 |
| TW | M270407 | 10/1993 |

* cited by examiner

LOOP TYPE HEAT DISSIPATING APPARATUS WITH SPRAYER

BACKGROUND OF THE INVENTION

1. Field of the Invention

The present invention relates to heat dissipation techniques, and more particularly, to a loop type heat dissipating apparatus for use with an active cooling technique.

2. Description of the Prior Art

As the electronic and information industries continue to develop, people nowadays have visions of owning electronic products which are multi-function, fast at computation and miniaturized. Manufacturers make efforts to enhance the performance of electronic products, thus producing electronic products which are more and more power-consuming. What the manufacturers are also multiplying is the heat flux of a heat source inside the electronic products produced, such as a CPU, laser diode, LED array, and multi-chip module (MCM). Hence, great importance is attached to rapid heat transfer across tiny space inside an electronic product.

Taking a CPU as an example, existing designs of heat dissipations are, namely a heat spreader, a heat pipe disposed between cooling fins, a loop heat pipe, a droplet-cooling heat dissipating apparatus, and etc.

There are patents related to a heat dissipating apparatus with a heat spreader, namely Taiwanese utility model Nos. M270407 and M260724. The purpose of a heat spreader is to take in heat evenly and thereby prevent uneven heat dissipation. Nevertheless, the performance of a conventional cooler equipped with a heat spreader is subject to the thermal conductivity of a constituent material and thereby achieves only passive cooling, thus being unfit to meet the increasingly strict requirements for heat dissipation.

There are patents related to a heat pipe, namely Taiwanese Patent Nos. I241156, I236337, I225584, and etc. A heat pipe removes a huge amount of heat by phase change. Referring to FIG. 1, a conventional heat pipe 10 is filled with a working fluid, and the direction in which the liquid phase of the working fluid flows 101 is opposite to the direction in which the gaseous phase of the working fluid flows 103.

However, in so doing, thermal resistance increases and thereby limits the maximum quantity of heat transferred. In addition, the heat pipe 10 using a wick structure 109 is disadvantaged due to great flow resistance and thereby unfit to deal with great heat flux. Last but not least, a conventional heat pipe has drawbacks, such as short heat transfer distance and small contact surface area.

There are patents related to a loop type heat dissipating apparatus, namely Taiwanese Patent Nos. 508487 and 502101. A conventional loop type heat dissipating apparatus, such as a micro loop heat pipe, is shown in FIG. 2 which depicts a loop type heat dissipating apparatus 20 comprising an evaporator 201 and a condenser 203 working in conjunction with a liquid phase working fluid channel 205 and a gaseous phase working fluid channel 207 spaced apart therefrom, thus the loop type heat dissipating apparatus 20 is spatially flexible and capable of long-distance heat transfer.

Although the liquid phase of the working fluid returns to the condenser 203 after being evaporated by the evaporator 201, the liquid phase of the working fluid forms a liquid film (not shown) at the bottom of the evaporator 201 and thereby increases the thermal resistance of the heat dissipating apparatus.

Taiwanese Patent No. I251656 discloses a pool boiling heat dissipating apparatus which comprises a buffer space whereby a boiling fluid steadily comes into contact with a heat dissipating surface. However, as stated in J. Yang, "Spray Cooling with an Air Atomizing Nozzle," Ph. D. Thesis, University of Kentucky, Lexington, Ky., 1993, taking water as an example, the heat transfer coefficient of a pool boiling heat dissipating apparatus is $5 \times 10^4$ W/m²K approximately, whereas that of spray cooling exceeds $5 \times 10^5$ W/m²K, and thus the performance of a heat dissipating system can be enhanced by spray cooling.

A droplet cooling device disclosed in Embedded Droplet Impingement for Integrated Cooling of Electronics (EDIFICE) presented by the America-based Carnegie Mellon University involves spraying microdroplets to an area where a hot spot is created on a heat source, removing heat from the hot spot by phase change of the microdroplets, conveying vapor to a condenser having a heat sink, such as a cooling fin, a cooler, and a fan, by a vapor conveying path, condensing the vapor to liquid, and sending the liquid to micro-orifices under a pressure gradient provided by a driving pump, so as to keep the heat dissipation cycle going and provide the cooling function.

Nonetheless, a droplet cooling device based on spray cooling requires an external pump to expel droplets out of micro-orifices, which increases the overall volume inevitably and therefore fails to meet the requirements for product miniaturization.

Accordingly, an issue that needs an urgent solution is related to endeavors to overcome the aforesaid drawbacks of the prior art.

SUMMARY OF THE INVENTION

In light of the aforesaid drawbacks of the prior art, it is a primary objective of the present invention to provide a loop type heat dissipating apparatus with a sprayer so as to enhance efficiency of heat dissipation.

Another objective of the present invention is to provide a loop type heat dissipating apparatus with a sprayer so as to reduce thermal resistance.

Yet another objective of the present invention is to provide a loop type heat dissipating apparatus with a sprayer so as to minimize accumulation of a working fluid at the bottom of the evaporator.

A further objective of the present invention is to provide a miniaturized loop type heat dissipating apparatus with a sprayer.

In order to achieve the above and other objectives, the present invention provides a loop type heat dissipating apparatus with a sprayer, for use in heat transfer between a heat source and a heat sink, comprising an evaporator, a condenser, and a working fluid. In contact with the heat source, the evaporator comprises a first chamber, a second chamber disposed underneath the first chamber, and a sprayer disposed therebetween. The condenser comprises a third chamber and a wick structure, the third chamber communicating with the second chamber, the wick structure being disposed on a side of the third chamber and communicating with the first chamber. The working fluid fills the loop type heat dissipating apparatus.

Preferably, the working fluid fills the wick structure all the way to the first chamber so as to be atomized and sprayed to the second chamber by the sprayer, evaporated by the heat source, conveyed to the third chamber, condensed, liquefied, and adheres to the wick structure. The sprayer is of two types, namely piezoelectric and capacitive. The liquid phase of the working fluid flows back to the first chamber under a pumping force actuated by the sprayer and completes the cycle of heat transfer.

As regards the loop type heat dissipating apparatus with a sprayer, the evaporator is panel-shaped. The sprayer comprises a diaphragm and a piezoelectric driving unit. The diaphragm includes a plurality of orifices. The piezoelectric driving unit, which abuts on the diaphragm, is a circular piezoceramic device. In a preferred embodiment, the loop type heat dissipating apparatus with a sprayer further comprises a first channel and a second channel. The first channel connects the first chamber and the wick structure. The second channel connects the second chamber and the third chamber. The first channel is a liquid-oriented pipe while the second channel is a gas-oriented pipe. Preferably, the second channel has a larger diameter than the first channel. The first channel is one of a capillary and a smooth pipe while the second channel is a smooth pipe. Another wick structure is disposed at a point of connection between the first channel and the condenser. The first channel and the second channel are parallel, or, alternatively, are crossed.

As regards the loop type heat dissipating apparatus with a sprayer, the evaporator and the condenser have a quantitative relationship which is one selected from the group consisting of a one-to-one relationship, a one-to-many relationship, a many-to-one relationship, and a many-to-many relationship. The wick structure comprises one selected from the group consisting of a plurality of grooves, a porous structure formed by sintered metal powder, a metal mesh, and a rough surface structure inside the condenser. The working fluid is a liquid which evaporates readily and has a high latent heat of evaporation, for example, pure water. The inside of the loop type heat dissipating apparatus is a low-pressure region so as to facilitate evaporation of the working fluid.

Compared to the prior art, the present invention discloses a loop type heat dissipating apparatus with a sprayer. The sprayer turns the liquid phase of the working fluid into microdroplets and ejects microdroplets to the heat source, such that no liquid film is formed at the bottom of the evaporator. Hence, a loop type heat dissipating apparatus with a sprayer disclosed by the present invention has less thermal resistance but is more efficient than a conventional loop heat pipe. The evaporator of the present invention is panel-shaped and thereby comes into contact with the heat source via a relatively large contact surface. The layout of both the first channel and the second channel of the present invention may be designed in light of the space available, so as to overcome the drawbacks of the prior art, namely short distance of heat transfer, and small contact surface area. In the present invention, the sprayer integrated into the evaporator has a pumping function embodying two merits. First, heat is dissipated more efficiently by spray cooling. Second, products are miniaturized, as the present invention functions well without a pump while the prior art uses a pump.

Accordingly, the loop type heat dissipating apparatus of the present invention increases heat dissipation efficiency, reduces thermal resistance, prevents accumulation of a working fluid at the bottom of the evaporator, achieves miniaturization, and enhances industrial applicability, thus solving the problems posed by the prior art.

DETAILED DESCRIPTION OF THE EMBODIMENTS

The present invention is herein illustrated with specific embodiments so that one skilled in the pertinent art can easily understand other advantages and effects of the present invention from the disclosure of the invention. It should be noted that, in the following embodiments, a loop type heat dissipating apparatus with a sprayer is applicable to heat transfer between a heat source (for example, a CPU, laser diode, LED array, and multi-chip module (MCM)) and a heat sink (for example, a cooling fin, a cooler, and a fan). The aforesaid kinds of heat sources and heat sinks are not herein described in detail, as they are known devices and known skills. Considering the way of driving, the sprayer is a capacitive device or alternatively a piezoelectric device; the choice is known and thereby is not herein described in detail.

First Embodiment

FIGS. 3 to 6B are drawings drawn according to the first embodiment of a loop type heat dissipating apparatus with a sprayer of the present invention.

Figure 1:
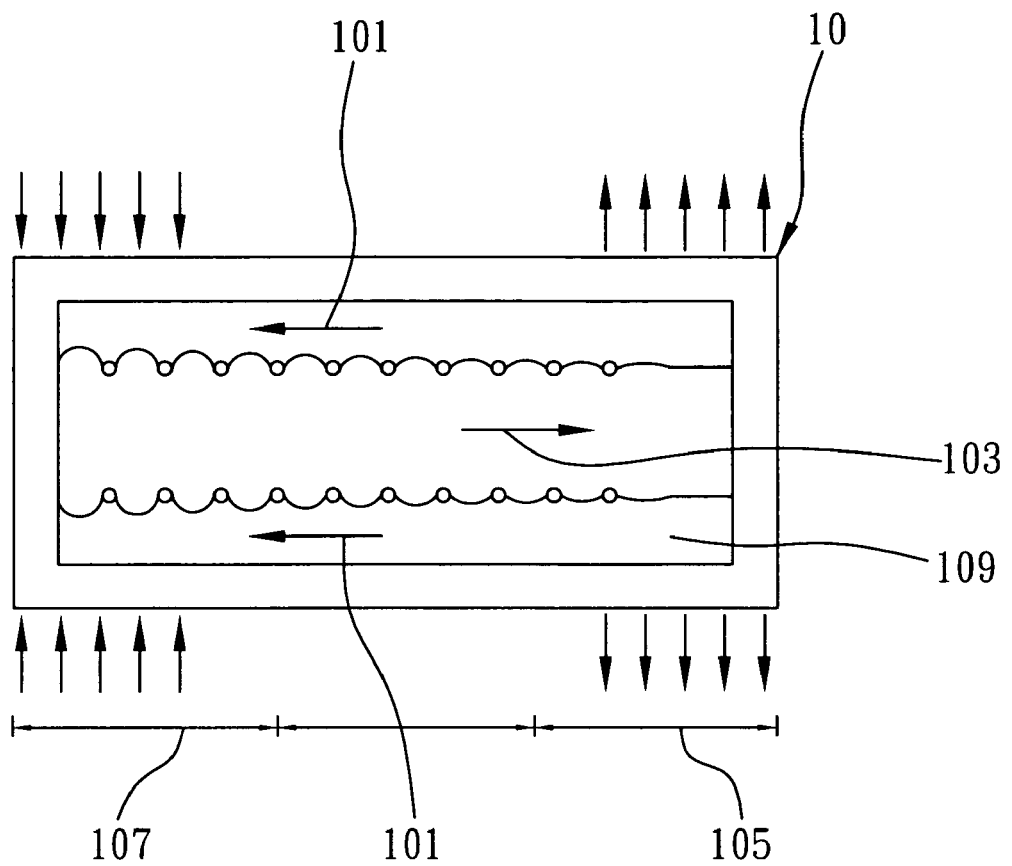
FIG. 1 (PRIOR ART) is a schematic view illustrating the principle of the operation of a conventional heat pipe.
Figure 2:
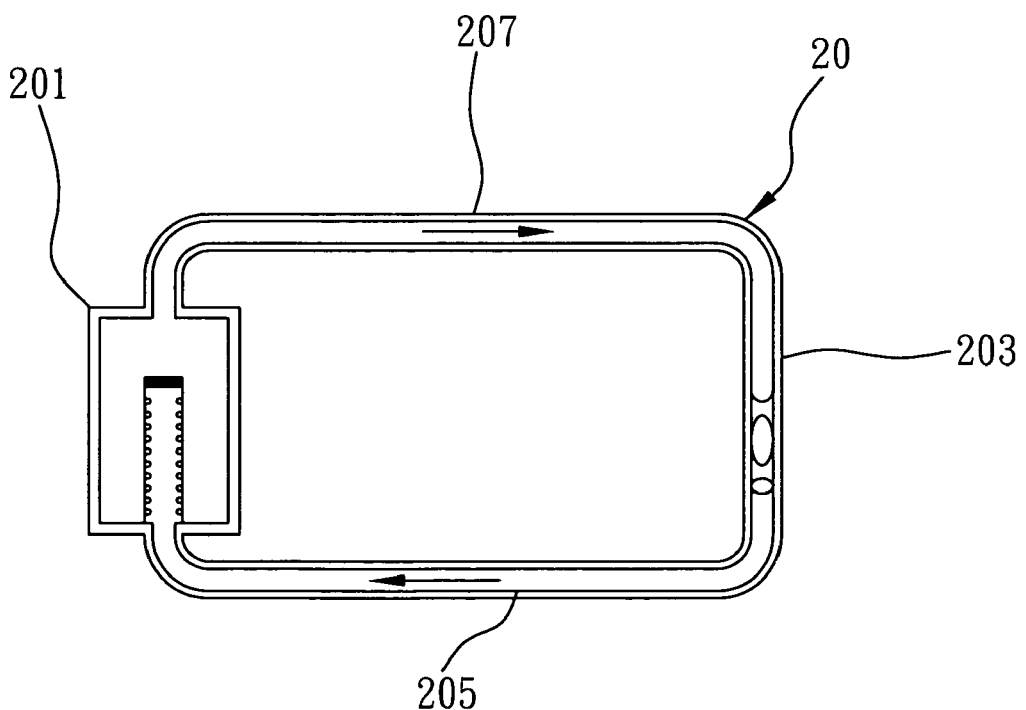
FIG. 2 (PRIOR ART) is a schematic view illustrating the principle of the operation of a conventional loop heat pipe.
Figure 3:
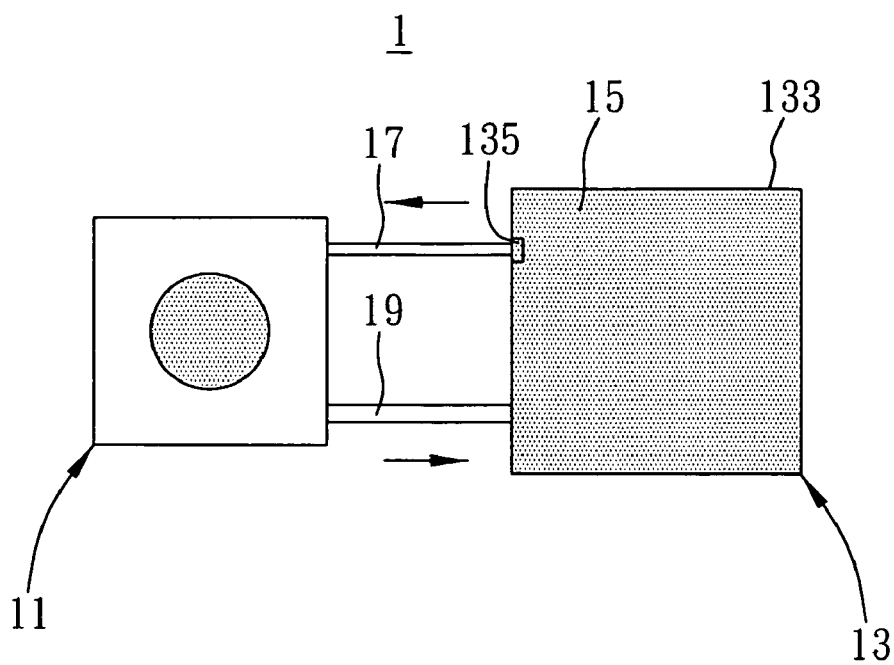
FIG. 3 is a schematic view showing a loop type heat dissipating apparatus with a sprayer of the first embodiment in accordance with the present invention.

Referring to FIG. 3 which is a schematic view showing a loop type heat dissipating apparatus 1 with a sprayer of the present invention. As shown in the drawing, the loop type heat dissipating apparatus 1 is applicable to heat transfer between a heat source and a heat sink (neither is shown). The loop type heat dissipating apparatus 1 comprises an evaporator 11, a condenser 13 communicating with the evaporator 11, and a working fluid 15 flowing between the evaporator 11 and the condenser 13. Connected between the evaporator 11 and the condenser 13 are a first channel 17 and a second channel 19. Although in this embodiment the evaporator 11 and the condenser 13 are connected by both the first channel 17 and the second channel 19, a means to connection is not limited to this embodiment and what are disclosed in the accompanying drawings. For instance, an opening for connecting the evaporator 11 and the condenser 13 may be disposed therebetween, or, alternatively, any other equivalent component may be disposed for connecting the evaporator 11 and the condenser 13.

Figure 4:
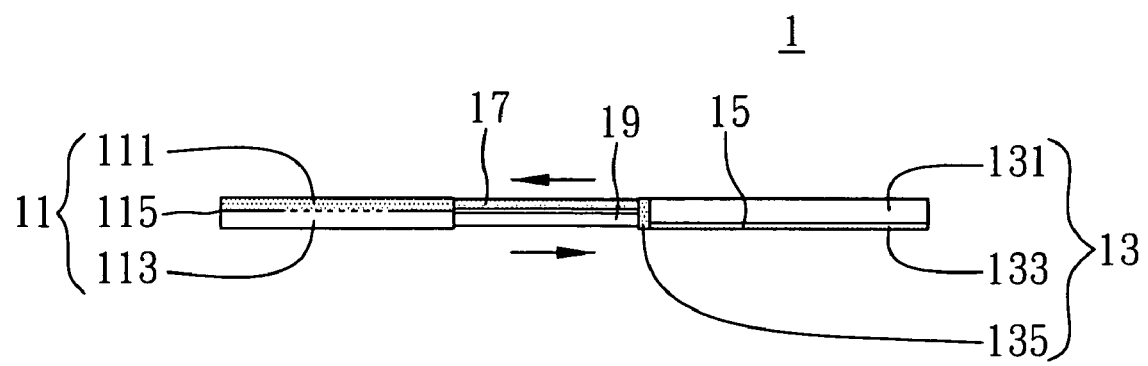
FIG. 4 is a lateral view showing a loop type heat dissipating apparatus with a sprayer depicted in FIG. 3.
Figure 5:
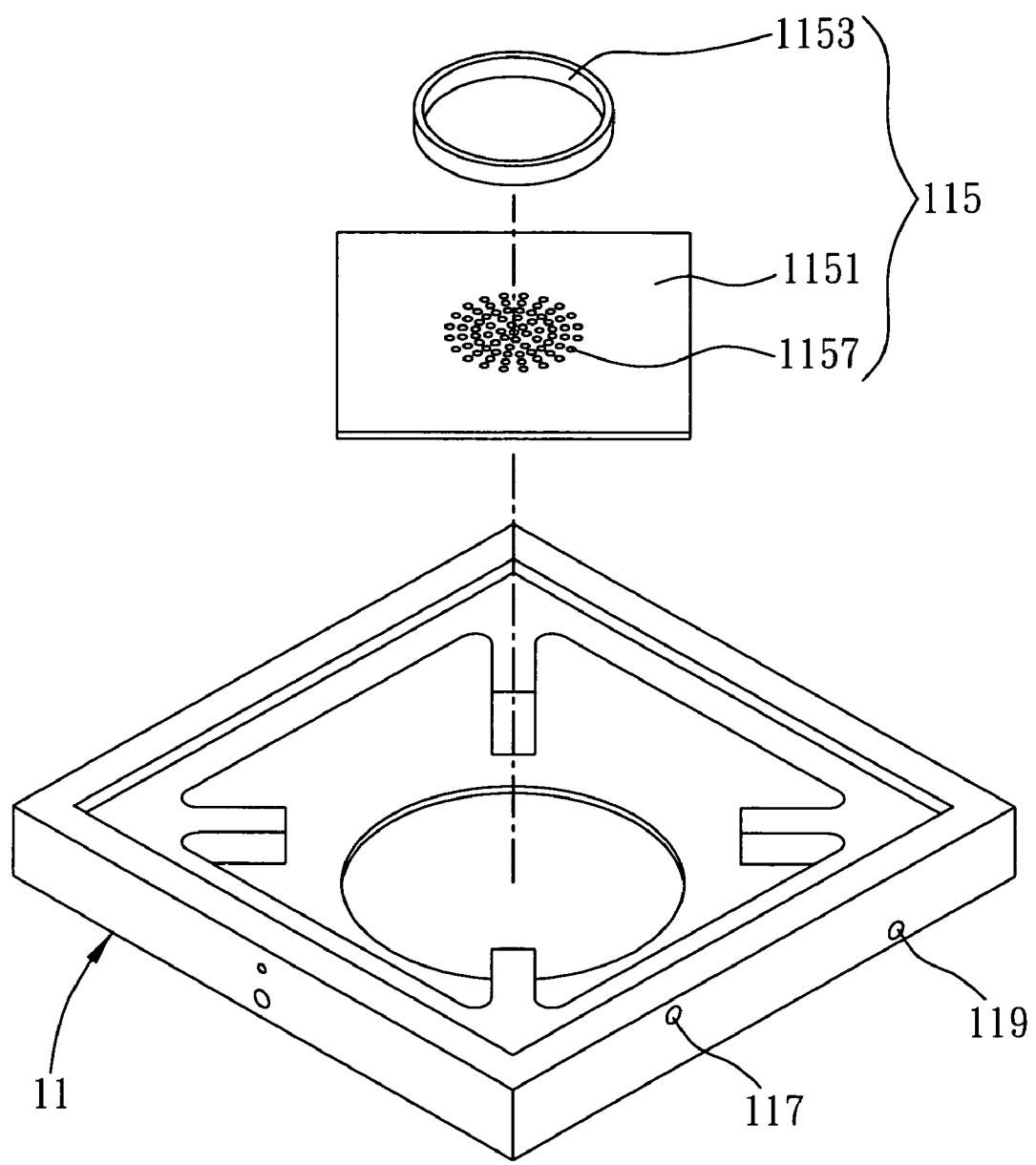
FIG. 5 is an exploded view showing an evaporator depicted in FIG. 3.

Referring to FIGS. 3 and 4, in contact with the heat source, the evaporator 11 comprises a first chamber 111, a second chamber 113 disposed underneath the first chamber 111, and a sprayer 115 disposed therebetween. The loop type heat dissipating apparatus 1 of this embodiment further comprises a working fluid 15. As shown in FIG. 5, in this embodiment, the evaporator 11 which is panel-shaped comprises a first through-hole 117 and a second through-hole 119. The first through-hole 117 communicates with both the first chamber 111 and the first channel 17. The second through-hole 119 communicates with both the second chamber 113 and the second channel 19.

The sprayer 115 comprises a diaphragm 1151 and a driving unit 1153. The driving unit 1153 which abuts on the diaphragm 1151 comprises a plurality of orifices 1157. The diaphragm 1151 is a metal film while the orifices 1157 are tiny round holes having an average diameter of 30 micron. The driving unit 1153 is a piezoelectric device for piezo-actuation, for example, a circular piezoceramic device.

In contact with the heat sink, the condenser 13 comprises a third chamber 131 and a wick structure 133. The third chamber 131 communicates with the second chamber 113. The wick structure 133 is disposed on one side of the third chamber 131 and communicates with the first chamber 111. In this embodiment, the wick structure 133 is disposed at the bottom of the third chamber 131 while a wick structure 135 is disposed at the point of connection between the first channel 17 and the wick structure 133. Owing to the wick structure 135, the working fluid 15 is confined to the first chamber 111, the first channel 17, the wick structure 135 and the wick structure 133. The working fluid 15 flows back to the first chamber 111 under a capillary action of the wick structure 135 and completes the cycle of heat transfer.

In this embodiment, the wick structure 133 includes, but is not limited to, a porous structure formed by sintered metal powder. Alternatively, the wick structure 133 can be a plurality of grooves, a metal mesh, or a rough surface structure inside the condenser 13. In other words, the wick structure 133 can be whatever is capable of confining the working fluid 15 to a surface of the condenser 13 and conveying liquid by a capillary action.

Figure 6A:
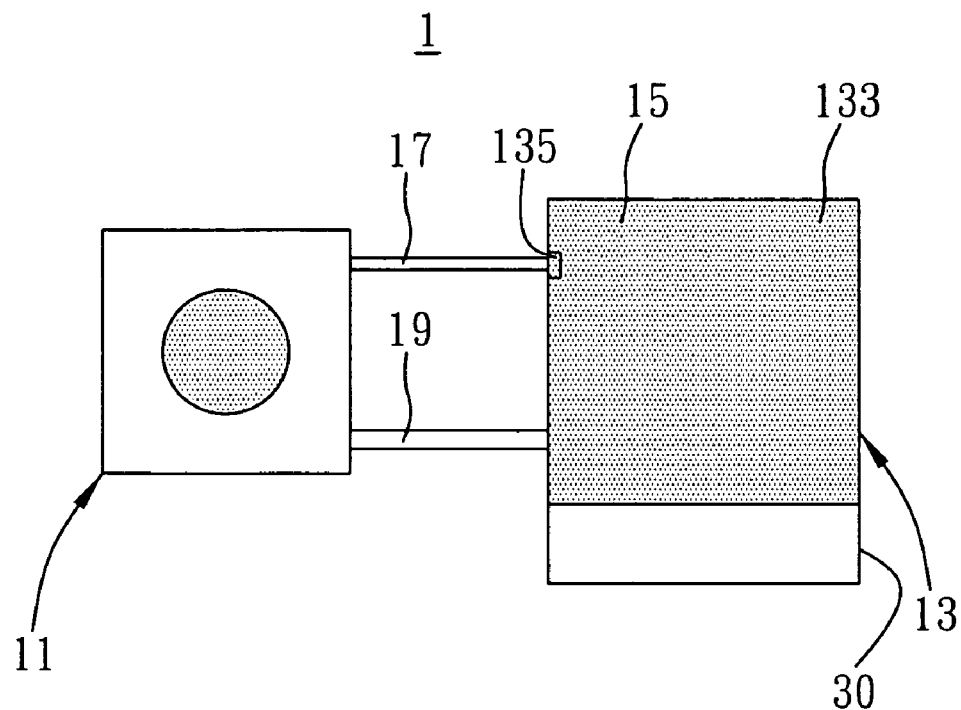
FIGS. 6A and 6B are schematic views showing a variation of a loop type heat dissipating apparatus with a sprayer of the first embodiment in accordance with the present invention.
Figure 6B:
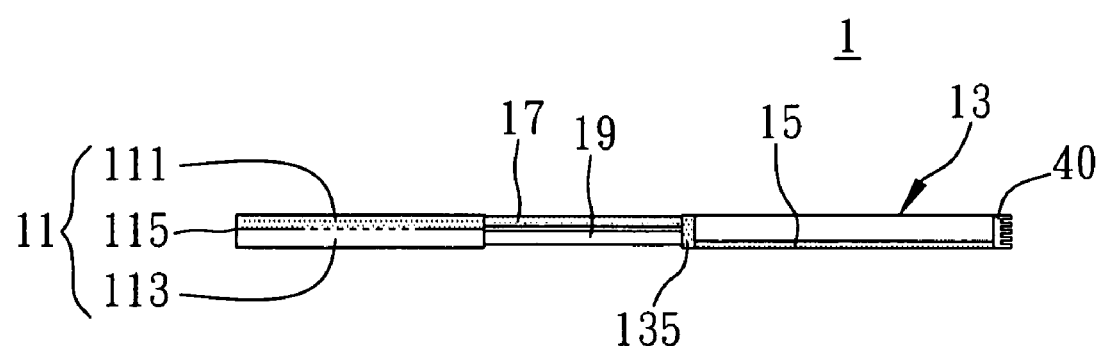

The condenser 13 comprises a surface which is mostly smooth except one disposed with the wick structure 133 and the wick structure 135. As shown in FIG. 6A, the condenser 13 may be in contact with a heat spreader 30, or, alternatively, the heat spreader 30 may be affixed to the condenser 13. As shown in FIG. 6B, a cooling structure 40 is disposed on an external surface of the condenser 13 so as to increase the heat dissipation efficiency. The shape and layout of the heat spreader 30 and the cooling structure 40 are not limited to what are described in this embodiment, as they may be supplemented or changed by persons ordinarily skilled in the art if necessary.

The working fluid 15 fills the wick structure 133 all the way to the first chamber 111 so as to be atomized and sprayed to the second chamber 113 by the sprayer 115, evaporated by the heat source, conveyed to the third chamber 131, condensed, liquefied, and adheres to the wick structure 133. The liquid phase of the working fluid 15 flows back to the first chamber 111 under a pumping force actuated by the sprayer 115 and completes the cycle of heat transfer. In this embodiment, the working fluid 15 is, for example, pure water, methanol, acetone, ammonia, or any appropriate fluid which evaporates readily and has a high latent heat of evaporation.

The first channel 17 connects the first chamber 111 and the wick structure 135. The second channel 19 connects the second chamber 113 and the third chamber 131. The first channel 17 and the second channel 19 are parallel. In this embodiment, the first channel 17 is a liquid line while the second channel 19 is a vapor line. The second channel 19 has a larger diameter than the first channel 17. The wick structure 135 is disposed at a point of connection between the first channel 17 and the condenser 13 and is configured to guide the working fluid 15. The first channel 17 is one of a capillary and a smooth pipe. The second channel 19 is a smooth pipe.

It should be noted that, in this embodiment, the first channel 17 and the second channel 19 are disposed between the evaporator 11 and the condenser 13 such that their layouts are spatially flexible but are not limited to those of this embodiment. For instance, the first channel 17 and the second channel 19 can be disposed as a whole between the evaporator 11 and the condenser 13. In other words, persons ordinarily skilled in the art may modify the layout of a connection between the evaporator 11 and the condenser 13 when necessary, so as to provide the cycle of heat dissipation for the working fluid 15.

It should also be noted that, as shown in the drawings, the evaporator 11 and the condenser 13 has a one-to-one quantitative relationship which merely illustrates the structure of the loop type heat dissipating apparatus of the present invention in a schematic manner. In fact, the structures shown in the drawings are not drawn according to a practical case in terms of quantity, shape and size. In practice, the quantitative relationship between the evaporator 11 and the condenser 13 is one selected from the group consisting of a one-to-one relationship, a one-to-many relationship, a many-to-one relationship, and a many-to-many relationship.

When the sprayer 115 is idle and still, the capillary action generated toward the working fluid 15 by the plurality of orifices 1157 is exactly offset by the weight of the working fluid 15 above the diaphragm 1151. As soon as the diaphragm 1151 starts to vibrate under a voltage, the sprayer 115 disposed right above the heat source turns the liquid phase of the working fluid 15 into microdroplets and conveys microdroplets to the heat source. In so doing, the heat generated by the heat source causes the droplets sprayed over the heat source to undergo phase change, and thus the heat is removed from the heat source because of the latent heat of evaporation, and the goal of spray cooling is achieved.

Afterward, the working fluid 15 is evaporated to gas, and then the gas phase of the working fluid 15 flows toward the condenser 13 via the second channel 19. Then, inside the condenser 13, the gas phase of the working fluid 15 condenses to liquid and adheres to the wick structure 133. Inasmuch as the wick structure 133 is disposed at the bottom of the condenser 13 and the wick structure 135 at a point of connection between the condenser 13 and the first channel 17, the liquid phase of the working fluid 15 in the condenser 13 flows back to the evaporator 11 and completes the cycle of heat transfer under the capillary action of the wick structure 133 and the wick structure 135 as well as the pumping force actuated by vibration of the sprayer 115.

Accordingly, in this embodiment, performance of a heat dissipating apparatus is enhanced by spray cooling, and flow resistance is reduced by a structure for the separation of liquid and gas flow, thus increasing heat transfer and enhancing heat dissipation efficiency.

Second Embodiment

Figure 7:
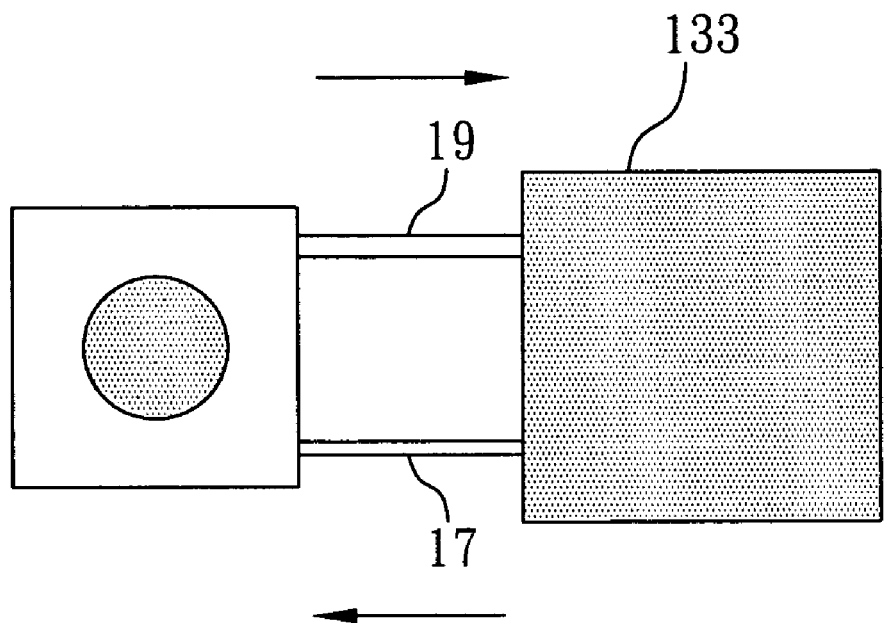
FIG. 7 is a schematic view showing a loop type heat dissipating apparatus with a sprayer of the second embodiment in accordance with the present invention.
Figure 8:
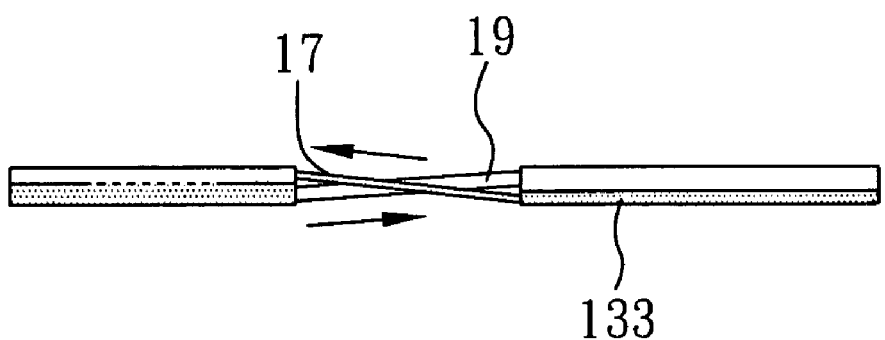
FIG. 8 is a lateral view showing a loop type heat dissipating apparatus with a sprayer depicted in FIG. 7.

FIGS. 7 and 8 are schematic views showing a loop type heat dissipating apparatus with a sprayer of the second embodiment in accordance with the present invention. The drawings use the same or similar denotations for any second embodiment components the same as or similar to the corresponding first embodiment components, and the description is concise, This embodiment markedly differs from the first embodiment in that the first channel and the second channel are parallel in the first embodiment but crossed in the second embodiment.

As shown in FIGS. 7 and 8, not only are the first channel 17 and the second channel 19 crossed, but the first channel 17 is directly connected to the wick structure 133, and thus the wick structure 135 of the first embodiment is spared.

Unlike the prior art, this embodiment involves using a sprayer to dissipate the heat of a heat source by spray cooling, so as to increase the efficiency of heat dissipation and prevent the liquid phase of a working fluid from accumulating at the bottom of an evaporator. And further, thermal resistance decreases greatly, not only because there is no wick structure at the bottom of the evaporator, but also because the evaporator is panel-shaped and thereby comes into contact with the heat source through a large contact surface. Last but not least, the panel-shaped evaporator absorbs a huge amount of heat through phase change and thereby eliminates a heat spot of the heat source.

With a sprayer being driven by piezoelectric or capacitive means, the diaphragm vibrates and actuates a pumping force. The pumping force, coupled with the wick structures, allows the working fluid to complete the cycle of heat transfer without an external pump and brings advantages like compactness and low power consumption. Installing the sprayer inside the evaporator decreases the size of the loop type heat dissipating apparatus greatly and thereby is conducive to product miniaturization.

The foregoing specific embodiments are only illustrative of the features and functions of the present invention but are not intended to restrict the scope of the present invention. It is apparent to those skilled in the art that all equivalent modifications and variations made in the foregoing embodiments according to the spirit and principle in the disclosure of the present invention should fall within the scope of the appended claims.

What is claimed is:

1. A loop type heat dissipating apparatus with a sprayer,
an evaporator for being in contact with a heat source, the evaporator comprising a first chamber, a second chamber disposed underneath the first chamber, and the sprayer disposed between the first chamber and the second chamber;
a condenser for being in contact with a heat sink, the condenser comprising a third chamber and a wick structure, the third chamber communicating with the second chamber, the wick structure being disposed on a side of the third chamber and communicating with the first chamber; and
a working fluid for filling the loop type heat dissipating apparatus,
wherein the sprayer comprises a driving unit abutting on a diaphragm and the diaphragm having a plurality of orifices, and the diaphragm vibrates under a voltage transmitted from the driving unit so as to cause the sprayer to turn a liquid phase of the working fluid into microdroplets, and to convey the microdroplets to the heat source below the sprayer.

2. The loop type heat dissipating apparatus with a sprayer of claim 1, wherein the evaporator is panel-shaped.

3. The loop type heat dissipating apparatus with a sprayer of claim 1, further comprising a first channel and a second channel, the first channel connecting the first chamber and the wick structure, the second channel connecting the second chamber and the third chamber.

4. The loop type heat dissipating apparatus with a sprayer of claim 3, wherein the first channel is a liquid line while the second channel is a vapor line.

5. The loop type heat dissipating apparatus with a sprayer of claim 3, wherein the second channel has a larger diameter than the first channel.

6. The loop type heat dissipating apparatus with a sprayer of claim 3, wherein the first channel is one of a capillary and a smooth pipe.

7. The loop type heat dissipating apparatus with a sprayer of claim 3, wherein the first channel is connected to the condenser and a wick structure is disposed at the junction of the first channel and the condenser.

8. The loop type heat dissipating apparatus with a sprayer of claim 3, wherein the second channel is a smooth pipe.

9. The loop type heat dissipating apparatus with a sprayer of claim 3, wherein the first channel and the second channel are parallel.

10. The loop type heat dissipating apparatus with a sprayer of claim 3, wherein the first channel and the second channel are crossed.

11. The loop type heat dissipating apparatus with a sprayer of claim 1, wherein the evaporator and the condenser have a one-to-one relationship in terms of quantity.

12. The loop type heat dissipating apparatus with a sprayer of claim 1, wherein the wick structure comprises a rough surface structure inside the condenser.

13. The loop type heat dissipating apparatus with a sprayer of claim 1, wherein the working fluid fills the wick structure, the first channel and the first chamber.

* * * * *